US010816576B2

(12) United States Patent
Sato et al.

(10) Patent No.: US 10,816,576 B2
(45) Date of Patent: Oct. 27, 2020

(54) COOLING DEVICE FOR SEMICONDUCTOR INSPECTION APPARATUS TO ADJUST TEMPERATURE OF INSPECTION APPARATUS OF SEMICONDUCTOR WAFER

(71) Applicant: ADTEX Inc., Takasaki-shi, Gunma (JP)

(72) Inventors: Hiroo Sato, Takasaki (JP); Satoshi Kobayashi, Takasaki (JP); Makoto Kaneshima, Takasaki (JP)

(73) Assignee: ADTEX Inc., Takasaki-shi, Gunma (JP)

( * ) Notice: Subject to any disclaimer, the term of this patent is extended or adjusted under 35 U.S.C. 154(b) by 43 days.

(21) Appl. No.: 16/303,142

(22) PCT Filed: Jun. 1, 2016

(86) PCT No.: PCT/JP2016/066223
§ 371 (c)(1),
(2) Date: Nov. 20, 2018

(87) PCT Pub. No.: WO2017/208393
PCT Pub. Date: Dec. 7, 2017

(65) Prior Publication Data
US 2019/0219614 A1 Jul. 18, 2019

(51) Int. Cl.
*G01R 1/44* (2006.01)
*F25B 25/00* (2006.01)
*F25D 17/02* (2006.01)

(52) U.S. Cl.
CPC .............. *G01R 1/44* (2013.01); *F25B 25/005* (2013.01); *F25D 17/02* (2013.01)

(58) Field of Classification Search
CPC ..... F25B 25/005; G01R 1/44; G01R 31/2877; F25D 17/02
See application file for complete search history.

(56) References Cited

U.S. PATENT DOCUMENTS

2004/0129015 A1* 7/2004 Apparao ............... F25B 7/00
62/335
2014/0073066 A1 3/2014 Tabuchi

FOREIGN PATENT DOCUMENTS

JP 2009-278007 A 11/2009
JP 2013-205955 A 10/2013

OTHER PUBLICATIONS

International Search Report for PCT/JP2016/066223 dated Aug. 16, 2016.
PCT written opinion dated Aug. 16, 2016.

* cited by examiner

*Primary Examiner* — Jay Patidar
(74) *Attorney, Agent, or Firm* — Yokoi & Co., U.S.A.; Toshiyuki Yokoi

(57) ABSTRACT

In a cooling device 20 of the present invention, a bypass passage 20C for allowing circulating liquid to partly or wholly bypass a heat exchanger 15; a first valve 21; and a second valve 22 are provided. Thus, the a cooling device 20 having a refrigerator 100 capable of cooling to a low temperature can be operated even at high temperature and heat can be removed even when the inspection temperature is high. Thus, the inspection can be performed both cases when the inspection temperature is high and low. Consequently, the semiconductor wafer generating a large amount of heat during the inspection can be also inspected without causing problems.

4 Claims, 3 Drawing Sheets

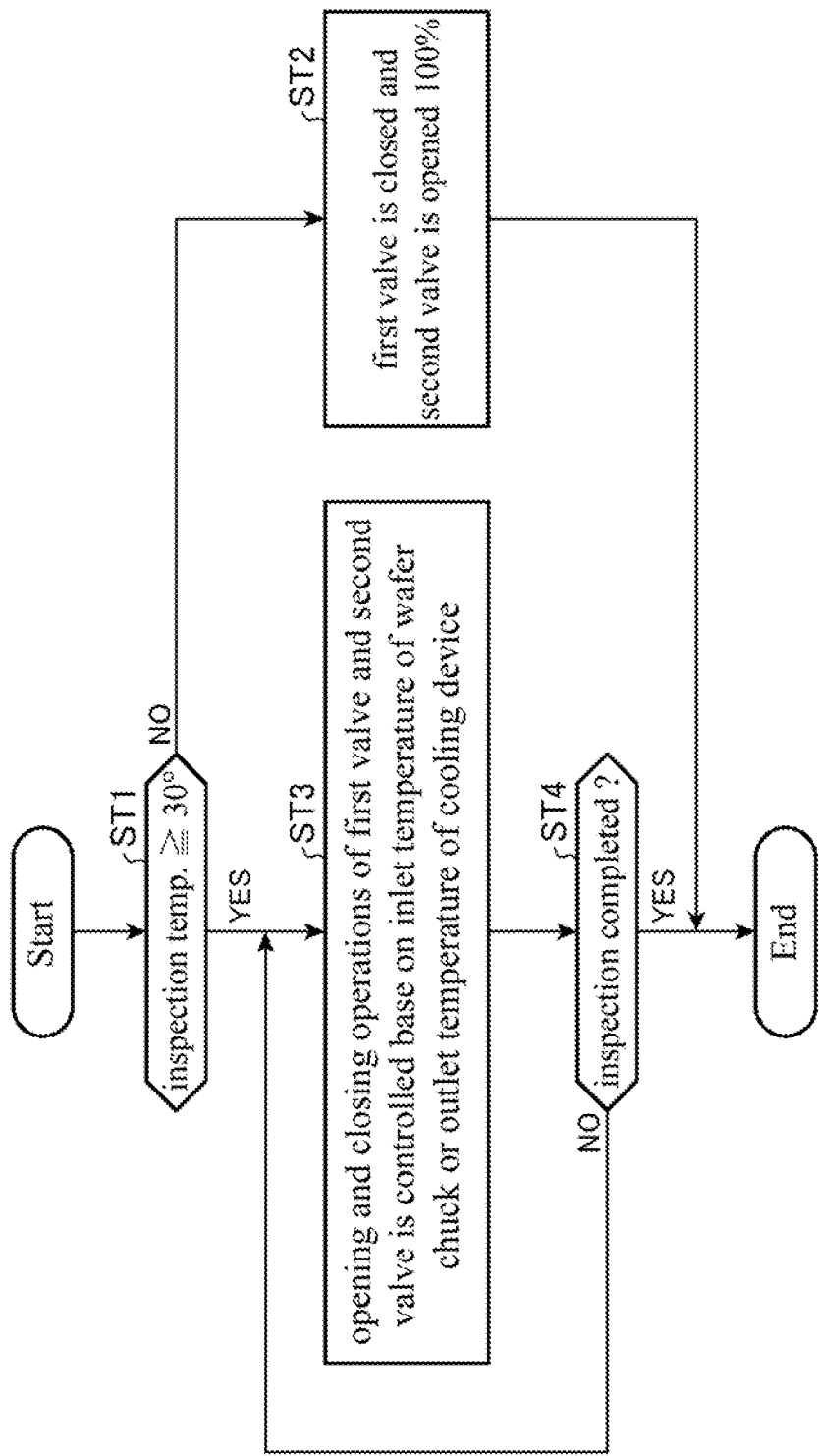

COOLING DEVICE FOR SEMICONDUCTOR INSPECTION APPARATUS TO ADJUST TEMPERATURE OF INSPECTION APPARATUS OF SEMICONDUCTOR WAFER

TECHNICAL FIELD

The present invention relates to a cooling device for a semiconductor inspection apparatus to adjust a temperature of an inspection apparatus of a semiconductor wafer.

BACKGROUND ART

Conventionally, a device called a "prober" is generally used for inspecting electric characteristics of a semiconductor device formed on the wafer in a state of the semiconductor wafer. At this time, the wafer is placed on a chuck housed in the prober and the temperature of the chuck is adjusted to inspect the wafer at the necessary temperature (e.g., −60° C. to 150° C.). Circulating liquid is supplied from the chiller (cooling device) to the chuck while the temperature of the circulating liquid is adjusted. Finally, the temperature is adjusted by controlling a heater equipped on the chuck.

Here, the chiller (cooling device) is formed by, for example, a refrigerator using chlorofluorocarbon or the like. The heated circulating liquid returned from the chuck is cooled by the refrigerator. In general, the chiller (cooling device) is operated when an inspection temperature is low (e.g., less than 30° C.). When the inspection temperature is high (e.g., 30° C. or more), the operation of the chiller (cooling device) is stopped and the temperature is controlled only by the heater of the chuck.

PRIOR ART DOCUMENTS

Patent Documents

[Patent Document 1]
Japanese Unexamined Patent Application Publication No. 2009-278007

DISCLOSURE OF THE INVENTION

Problems to be Solved by the Invention

However, in recent years, the wafers (devices) generating a large amount of heat during the inspection are produced since the density of the semiconductor device becomes higher or because of other reasons. Consequently, different from the past, removal of heat is required in many cases even when the inspection temperature is high. The refrigerator should be operated for removing (radiating) the heat. However, there is a problem that the pressure is increased when using the refrigerator capable of cooling to a low temperature if the heat required to be removed is large. Thus, the refrigerator cannot be operated by receiving too much load. In such a case, the inspection apparatuses should be prepared separately for the cases when the inspection temperature is high and when the inspection temperature is low.

The present invention is made for solving the above described problems. The present invention aims for providing a cooling device for a semiconductor inspection apparatus capable of performing the inspection regardless of when the inspection temperature is high or low.

Means for Solving the Problem

In order to achieve the above described purpose, the present invention relates to a cooling device for semiconductor inspection apparatus to adjust a temperature of an inspection apparatus of a semiconductor wafer, the cooling device includes: a controller for controlling the temperature of a wafer chuck on which the semiconductor wafer is placed; a circulating liquid passage through which circulating liquid for cooling the wafer chuck flows; and a refrigerator for cooling the circulating liquid, characterized in that a tank for holding the circulating liquid of low temperature; a pump that circulates the circulating liquid held in the tank through the circulating liquid passage; and a heater for heating the circulating liquid are arranged on an upstream side of the wafer chuck in the circulating liquid passage, a heat exchanger of the refrigerator for cooling the circulating liquid is arranged on a downstream side of the wafer chuck in the circulating liquid passage, a bypass passage is provided for allowing the circulating liquid to bypass the refrigerator without passing through the heat exchanger of the refrigerator from a position between the wafer chuck and the heat exchanger in the circulating liquid passage, a first valve is provided on the bypass passage for adjusting the amount of the circulating liquid to flow in the bypass passage, and a second valve is provided on the circulating liquid passage for adjusting the amount of the circulating liquid to flow in the heat exchanger.

Effects of the Invention

By using the cooling device of the present invention, a cooling device having a refrigerator capable of cooling to a low temperature can be operated even at high temperature even when the inspection temperature is high. In addition, heat can be removed even when the inspection temperature is high. Thus, the inspection can be performed in both cases when the inspection temperature is high and low. The semiconductor wafer generating a large amount of heat during the inspection can be also inspected without causing problems.

BRIEF DESCRIPTION OF THE DRAWINGS

FIG. 3 is a flowchart showing an example of the operation of the controller in the cooling device of the semiconductor inspection apparatus concerning the embodiments of the present invention.

MODES FOR CARRYING OUT THE INVENTION

Figure 1:
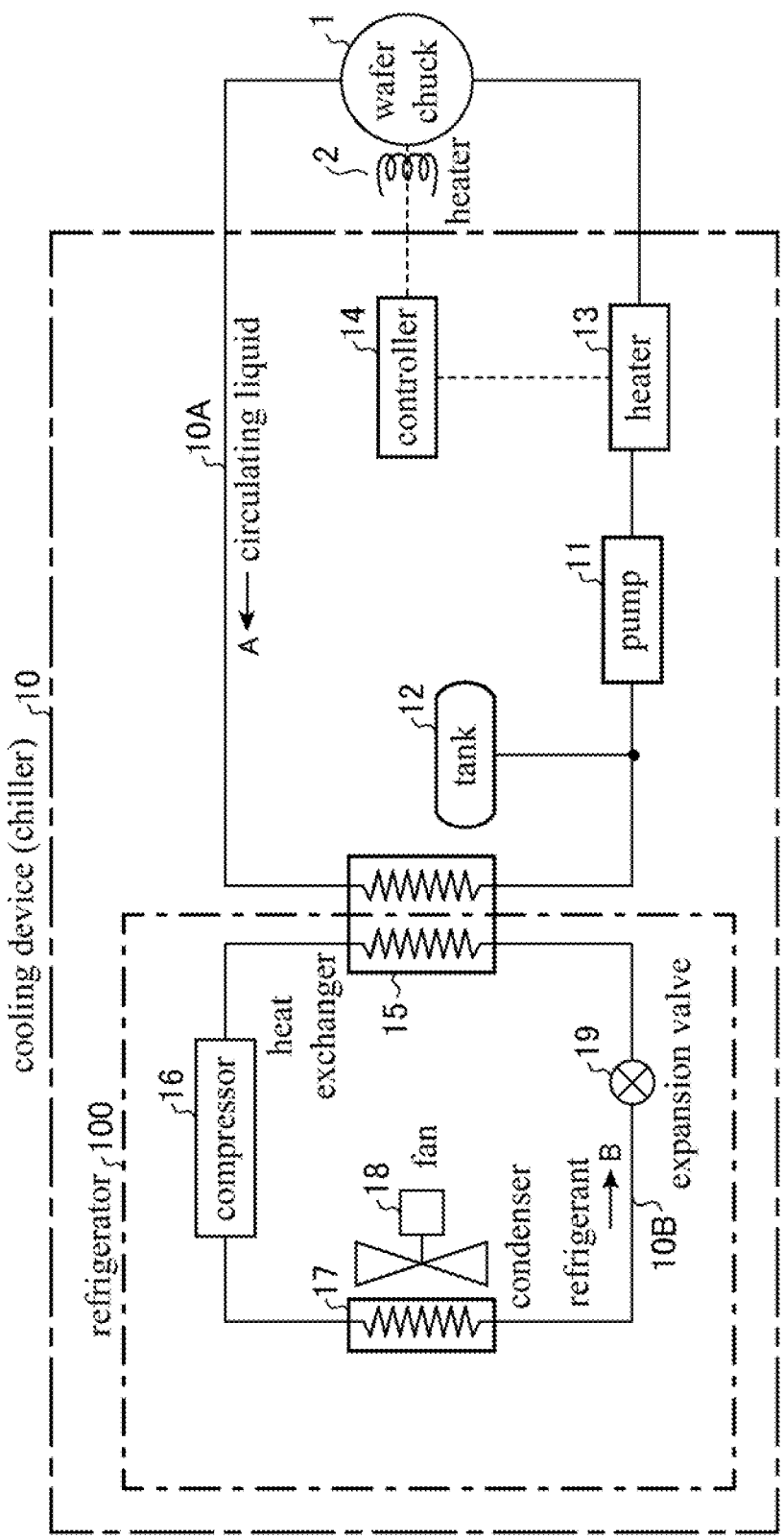
FIG. 1 is a drawing showing a brief configuration of a conventional cooling device for the semiconductor inspection apparatus.

The present invention relates to a cooling device (chiller) for a semiconductor inspection apparatus to adjust a temperature of an inspection apparatus of a semiconductor wafer. Hereafter, the embodiments of the present invention will be explained in detail referring to the drawings.

A device called prober is generally used for inspecting electric characteristics of the semiconductor device formed on the wafer in a state of the semiconductor wafer. At this time, the wafer is placed on a wafer chuck housed in the prober and the temperature of the chuck is adjusted to inspect the wafer at the necessary temperature (e.g., −60° C. to 150° C.). Circulating liquid is supplied from the cooling device (chiller) to the wafer chuck while the temperature of the circulating liquid is adjusted. Finally, the temperature is adjusted by controlling a heater equipped on the wafer chuck. Note that illustration and detailed explanation of the wafer chuck and the prober are omitted here because they have well known configuration.

FIG. 1 is a drawing showing a brief configuration of a conventional cooling device (chiller) 10 for the semiconductor inspection apparatus. As shown in FIG. 1, the cooling device 10 has a pump 11, a tank 12, a heater 13, a controller 14, a heat exchanger 15, a compressor 16, a condenser 17, a fan 18 and an expansion valve 19.

The controller 14 controls the temperature of the wafer chuck 1 on which the semiconductor wafer is placed by controlling a heater 2 provided on a wafer chuck 1 (heating the wafer chuck 1). In addition, as shown in FIG. 1, the cooling device 10 has: a circulating liquid passage 10A through which circulating liquid for cooling the wafer chuck 1 flows; and a refrigerator 100 for cooling the circulating liquid.

In the circulating liquid passage 10A, a tank 12 for holding the circulating liquid of low temperature, a pump 11 that is operated to circulate the circulating liquid held in the tank 12 through the circulating liquid passage 10A, and a heater 13 for heating the circulating liquid are arranged on an upstream side of the wafer chuck 1 in this order.

The pump 11 is operated to circulate the circulating liquid of low temperature held in the tank 12 in the order from the heater 13 to the wafer chuck 1. Namely, the circulating liquid is circulated through the circulating liquid passage 10A in a direction of the flow passage shown as an arrow A in the figure. Thus, the wafer chuck 1 is cooled.

In FIG. 1, a heat exchanger 15 of the refrigerator 100 for cooling the circulating liquid is arranged on a downstream side of the wafer chuck 1. Here, the refrigerator 100 is formed by the heat exchanger 15, the compressor 16, the condenser 17, the fan 18 and the expansion valve 19. In addition, the refrigerator 100 has a refrigerant flow passage 10B through which a refrigerant (cooling medium) such as chlorofluorocarbon flows.

In the refrigerator 100, the refrigerant (cooling medium) such as chlorofluorocarbon is supplied and circulated in the order of the compressor 16, the condenser 17, the expansion valve 19 and the heat exchanger 15. Namely, the refrigerant is circulated in a direction of the flow passage shown as an arrow B in the figure. Thus, the refrigerant evaporates to cool the heat exchanger 15. The refrigerant evaporated in the heat exchanger 15 is compressed in the compressor 16, cooled and liquefied in the condenser 17, passed through the expansion valve 19, and evaporated in the heat exchanger 15. Note that although the present embodiment is explained by using an example of air-cooling the condenser 17 by the fan 18, water-cooling can be also used. In addition, a dual refrigerator can be also used.

When the semiconductor wafer (not illustrated) is inspected at a predetermined temperature, the controller 14 controls the output (heating and cooling) of the heater 2 based on the inspection temperature of the semiconductor inspection apparatus and the temperature detected by a temperature sensor (not illustrated) housed in the wafer chuck 1 in a state that the semiconductor wafer is held by the wafer chuck 1 (in a state that the semiconductor wafer is placed on the wafer chuck). Thus, the temperature of the wafer chuck 1 is controlled to adjust the temperature of the semiconductor wafer to a predetermined temperature.

At this time, the heated circulating liquid returned from the wafer chuck 1 is cooled by the refrigerator 100. However, in general, the cooling device 10 is operated when the inspection temperature is low (e.g., 30° C. or less) and the cooling device 10 is stopped and the temperature is controlled only by the heater 2 of the chuck 1 when the inspection temperature is high (e.g., more than 30° C.).

Here, heat insulation cannot be performed completely from an outlet of the cooling device 10 (outlet of the heater 13) to an inlet of the wafer chuck 1. Therefore, the temperature of the circulating liquid increases if it is lower than the ambient temperature by receiving the heat. The temperature of the circulating liquid decreases if it is higher than the ambient temperature. For example, when the ambient temperature is 25° C. and an outlet temperature of the cooling device 10 (outlet temperature of the heater 13) is −30° C., an inlet temperature of the wafer chuck 1 slightly increases from −30° C. (e.g., increases to −28° C.). On the other hand, when the ambient temperature is 25° C. and the outlet temperature of the cooling device 10 (outlet temperature of the heater 13) is 90° C., the inlet temperature of the wafer chuck 1 slightly decreases from 90° C. (e.g. decreases to 88° C.).

Similarly, heat insulation cannot be performed completely from an outlet of the wafer chuck 1 to an inlet of the heat exchanger 15 (inlet of the refrigerator 100). Therefore, the temperature of the circulating liquid increases if it is lower than the ambient temperature by receiving the heat. On the other hand, the temperature of the circulating liquid decreases if it is higher than the ambient temperature. For example, when the ambient temperature is 25° C. and an outlet temperature of the wafer chuck 1 is −30° C., an inlet temperature of the heat exchanger 15 slightly increases from −30° C. (e.g., increases to −28° C.). On the other hand, when the ambient temperature is 25° C. and the outlet temperature of the wafer chuck 1 is 90° C., the inlet temperature of the heat exchanger 15 slightly decreases from 90° C. (e.g. decreases to 88° C.).

For example, when the inspection temperature is low temperature (e.g., −30° C.), the controller 14 controls the outlet temperature of the cooling device 10 (outlet temperature of the heater 13) by using the refrigerator 100 so that the circulating liquid enters in the wafer chuck 1 at the temperature slightly lower than the inspection temperature (e.g., −35° C.). In this case, the inlet temperature of the wafer chuck 1 increases slightly from −35° C. (e.g., −33° C.). Finally, the temperature of the wafer chuck 1 is controlled to the inspection temperature (i.e., −30° C.) by slightly increasing the output of the heater 2 of the wafer chuck 1.

On the other hand, when the inspection temperature is high (e.g., 90° C.), the inlet temperature of the wafer chuck 1 is slightly decreased (e.g., 88° C.). In this case, the refrigerator 100 is not operated and the temperature of the wafer chuck 1 is controlled to the inspection temperature (i.e., 90° C.) by slightly increasing the output of the heater 2 of the wafer chuck 1.

Here, the reference temperature for judging whether the inspection temperature is low or high is specified to 30° C. for explanation. However, it goes without saying that the reference temperature can be appropriately determined as necessary. For example, the reference temperature can be specified to 20° C. or 40° C. The more detailed explanation of FIG. 1 and the temperature control of the wafer chuck are omitted since they are a well-known conventional technology.

In recent years, the semiconductor wafers (devices) generating a large amount of heat during the inspection are produced since the density of the semiconductor device becomes higher or because of other reasons. Consequently, different from the past, removal of heat is required in many cases even when the inspection temperature is high. The refrigerator should be operated for removing (radiating) the heat. However, there is a problem that the pressure is increased when using the refrigerator capable of cooling to a low temperature if the heat required to be removed is large. Thus, the refrigerator cannot be operated by receiving too much load.

In the embodiments of the present invention, the bypass passage for allowing the circulating liquid to partly or wholly bypass the heat exchanger is added to the conventional cooling device for the semiconductor inspection apparatus. Thus, the semiconductor wafer can be inspected by using the same cooling device in both cases when the inspection temperature is high and low.

Embodiments

Figure 2:
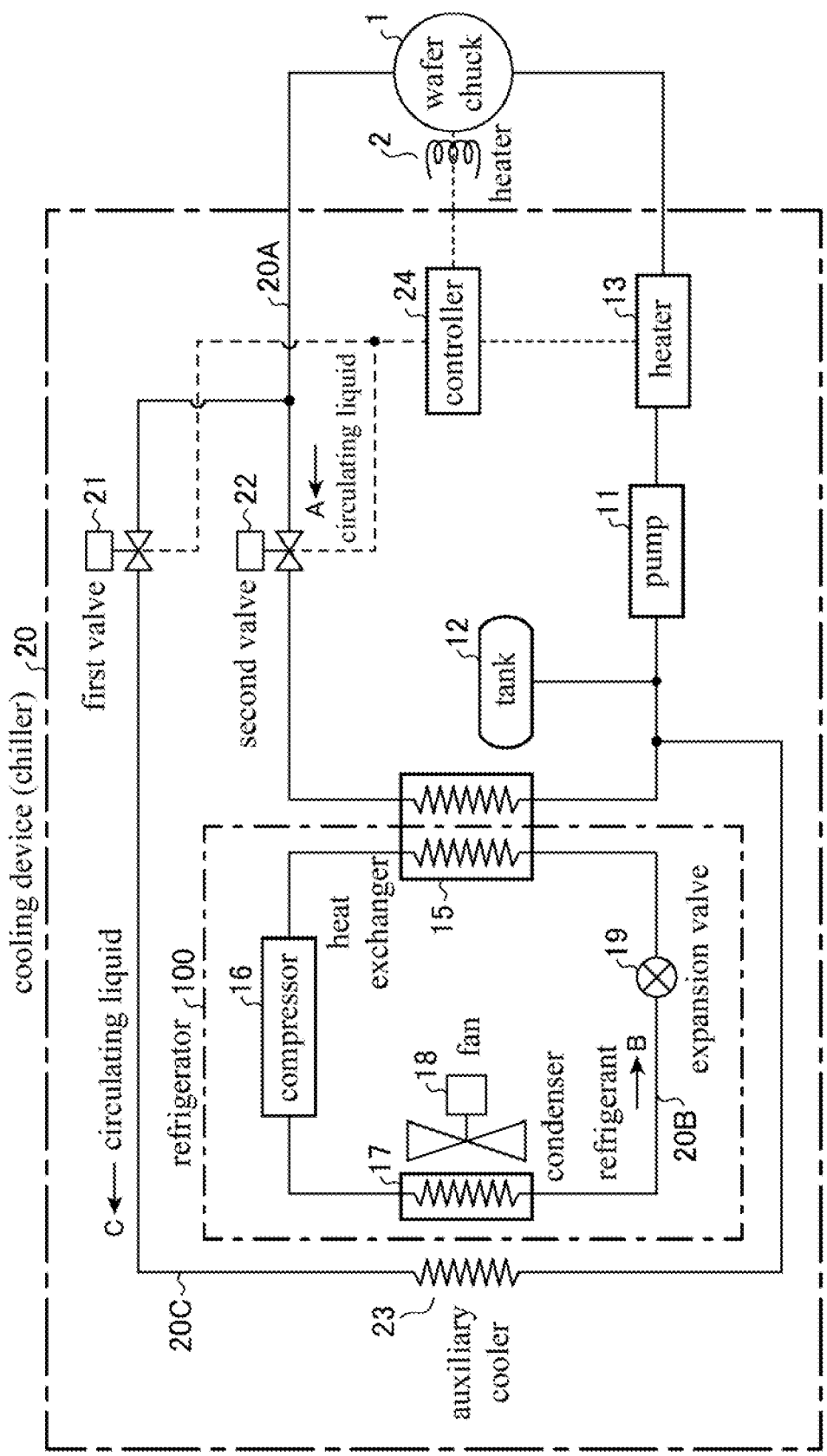
FIG. 2 is a drawing showing a brief configuration of a cooling device for the semiconductor inspection apparatus concerning the embodiments of the present invention.

FIG. 2 is a drawing showing a brief configuration of a cooling device (chiller) 20 for the semiconductor inspection apparatus concerning the embodiments of the present invention. As shown in FIG. 2, the cooling device 20 has a first valve 21, a second valve 22 and an auxiliary cooler 23 in addition to the pump 11, the tank 12, the heater 13, a controller 24, the heat exchanger 15, the compressor 16, the condenser 17, the fan 18 and the expansion valve 19. Note that the explanation will be omitted for the components having the same configuration as the components explained in FIG. 1 by applying the same reference numerals.

The controller 24 controls the temperature of the wafer chuck 1 on which the semiconductor wafer is placed by controlling the heater 2 provided on the wafer chuck 1 (by heating the wafer chuck 1). When the semiconductor wafer (not illustrated) is inspected at a predetermined temperature, the controller 24 controls the output (heating and cooling) of the heater 2 based on the inspection temperature of the semiconductor inspection apparatus and the temperature detected by a temperature sensor (not illustrated) housed in the wafer chuck 1 in a state that the semiconductor wafer is held by the wafer chuck 1 (in a state that the semiconductor wafer is placed on the wafer chuck). Thus, the temperature of the wafer chuck 1 is controlled to adjust the temperature of the semiconductor wafer to a predetermined temperature.

In addition, as shown in FIG. 2, the cooling device 20 has: a circulating liquid passage 20A through which circulating liquid for cooling the wafer chuck 1 flows; and a refrigerator 100 for cooling the circulating liquid. In the circulating liquid passage 20A, a tank 12 for holding the circulating liquid of low temperature, a pump 11 that is operated to circulate the circulating liquid held in the tank 12 through the circulating liquid passage 20A in a direction of the flow passage shown as an arrow A in the figure, and a heater 13 for heating the circulating liquid are arranged on an upstream side of the wafer chuck 1 in this order.

Also in FIG. 2, the cooling device 20 has a heat exchanger 15 of the refrigerator 100 for cooling the circulating liquid on a downstream side of the wafer chuck 1. The refrigerator 100 is formed by the heat exchanger 15, the compressor 16, the condenser 17, the fan 18 and the expansion valve 19. In addition, the refrigerator 100 has a refrigerant flow passage 20B through which a refrigerant (cooling medium) such as chlorofluorocarbon flows. Note that although the present embodiment is explained by using an example of air-cooling the condenser 17 by the fan 18, water-cooling can be also used. In addition, a dual refrigerator can be also used.

Furthermore, the cooling device 20 has a bypass passage 20C for allowing the circulating liquid to bypass the refrigerator 100 without passing through the heat exchanger 15 of the refrigerator 100 from a position between the wafer chuck 1 and the heat exchanger 15 in the circulating liquid passage 20A. Thus, the circulating liquid is circulated in a direction of the flow passage shown as an arrow C in the figure. Namely, the bypass passage 20C is a passage for allowing the circulating liquid partly or wholly bypass the heat exchanger 15. In addition, the auxiliary cooler 23 is provided on the bypass passage 20C. Although the auxiliary cooler 23 is an air-cooling device, the auxiliary cooler 23 is different from the refrigerator 100 which can cool the circulating liquid to a low temperature. When the refrigerator 100 is a water-cooling device, the water-cooling device is also used for the auxiliary cooler 23.

The first valve 21 is provided on the bypass passage 20C for adjusting the amount of the circulating liquid flowing in the circulating liquid passage 20A to flow in the bypass passage 20C. In addition, the second valve 22 is provided on the circulating liquid passage 20A for adjusting the amount of the circulating liquid to flow in the heat exchanger 15.

Namely, by using the first valve 21, a part of the circulating liquid flowing in the circulating liquid passage 20A can be switched to the bypass passage 20C to pass through the auxiliary cooler 23 instead of passing through the refrigerator 100 (heat exchanger 15). In addition, the second valve 22 is provided in the midway of the circulating liquid passage 20A. The second valve 22 can switch whether or not the circulating liquid is passed through the refrigerator 100 (heat exchanger 15) to be cooled by the refrigerator 100. Namely, the second valve can switch whether or not the refrigerator 100 is operated.

Note that both the first valve 21 and the second valve 22 can be an on/off type valve or an analog type valve. However, the embodiments will be explained as the analog-type valve which has a wider operating temperature range.

The controller 24 controls opening and closing operations of the first valve 21 and the second valve 22 based on the inspection temperature of the semiconductor inspection apparatus and the inlet temperature of the wafer chuck 1 or the outlet temperature of the cooling device 20. Thus, the controller 24 controls the temperature of the wafer chuck 1 by determining one of the flowing options: the wafer chuck 1 is cooled by the refrigerator 100; the wafer chuck 1 is cooled by the auxiliary cooler 23; the wafer chuck 1 is cooled by both the refrigerator 100 and the auxiliary cooler 23; or the wafer chuck 1 is not cooled.

For example, when the inspection temperature is low (i.e., 30° C. or less), the first valve 21 is completely closed and the second valve 22 is completely opened (opened 100%) to cool the heated circulating liquid returned from the wafer chuck 1 by the refrigerator 100.

Namely, when the first valve 21 is completely closed and the second valve 22 is completely opened (opened 100%), the circulating liquid is not bypassed from the circulating liquid passage 20A to the bypass passage 20C which is connected to the auxiliary cooler 23. Thus, the cooling device 20 functions similarly to the conventional cooling device 10.

In this case, the controller 24 functions similarly to the controller 14 of the conventional cooling device 10. Namely, the controller controls the outlet temperature of the cooling device 20 (outlet temperature of the heater 13) so that the circulating liquid enters in the wafer chuck 1 at the temperature slightly lower than the inspection temperature of the semiconductor inspection apparatus.

Specifically, when the inspection temperature is −30° C., for example, the controller controls the outlet temperature of the cooling device 20 (outlet temperature of the heater 13)

by the refrigerator 100 so that the circulating liquid enters in the wafer chuck 1 at the temperature slightly lower than the inspection temperature (e.g., −35° C.). In this case, the inlet temperature of the wafer chuck 1 increases slightly from −35° C. (e.g., −33° C.). Finally, the temperature of the wafer chuck 1 is controlled to the inspection temperature (i.e., −30° C.) by slightly increasing the output of the heater 2 of the wafer chuck 1.

On the other hand, when the inspection temperature is high (i.e., higher than 30° C.), the first valve 21 is gradually opened and the second valve 22 is gradually closed as the inspection temperature increases. For example, if the range of the inspection temperature is −60° C. to 150° C., the open/close degree of the first valve 21 and the second valve 22 is controlled only when the inspection temperature is high (i.e., 30° C. to 150° C.) in accordance with the difference between the inspection temperature and the inlet temperature of the wafer chuck 1 or the difference between the inspection temperature and the outlet temperature of the cooling device 20.

Namely, the first valve 21 is controlled to be opened 0% (completely closed) when the inspection temperature is 30° C. and opened 100% (completely opened) when the inspection temperature is 150° C. In addition, the second valve 22 is controlled to be opened 100% when the inspection temperature is 30° C. and opened 5% (almost closed), for example, when the inspection temperature is 150° C. Thus, the open/close degree of each valve is changed according to the inspection temperature when the inspection temperature is 30° C. to 150° C.

As explained above, when the inspection temperature is high (e.g., higher than 30° C.), the first valve 21 is gradually opened and the second valve 22 is gradually closed as the inspection temperature increases. In addition, the open/close degree of the first valve 21 and the second valve 22 is controlled in accordance with the difference between the inspection temperature and the inlet temperature of the wafer chuck 1 or the difference between the inspection temperature and the outlet temperature of the cooling device 20.

Consequently, a part of the circulating liquid is bypassed from the circulating liquid passage 20A to the bypass passage 20C and passed through the auxiliary cooler 23 and then circulated in the order of the tank 12, the pump 11 and the heater 13. Thus, the wafer chuck 1 is cooled by using both the refrigerator 100 and the auxiliary cooler 23.

Namely, in this case, while the refrigerator 100 is operated, a part of the circulating liquid is bypassed from the circulating liquid passage 20A to the bypass passage 20C and passed through the auxiliary cooler 23 and circulated in the flow passage of the tank 12 and the heater 13. Thus, the wafer chuck 1 can be cooled by using both lines. Because of this, heat can be removed efficiently without applying too much load to the refrigerator 100.

Specifically, when the amount of the heat generated from the semiconductor wafer is small, the controller 24 controls the outlet temperature (outlet temperature of the heater 13) of the cooling device 20 so that the circulating liquid enters in the wafer chuck 1 at the temperature slightly lower than the inspection temperature of the semiconductor inspection apparatus. For example, when the inspection temperature is 90° C., both the first valve 21 and the second valve 22 are opened approximately 50% and the degree of the open/close is further controlled. Thus, the outlet temperature of the cooling device 20 (outlet temperature of the heater 13) is controlled by both the refrigerator 100 and the auxiliary cooler 23 so that the circulating liquid enters in the wafer chuck 1 at the temperature slightly lower than the inspection temperature (e.g., 89° C.). Finally, the temperature of the wafer chuck 1 is controlled to the inspection temperature (i.e., 90° C.) by slightly increasing the output of the heater 2 of the wafer chuck 1.

On the other hand, when the amount of the heat generated from the semiconductor wafer is large, the controller 24 controls the outlet temperature (outlet temperature of the heater 13) of the cooling device 20 so that the circulating liquid enters in the wafer chuck 1 at the temperature significantly lower than the inspection temperature of the semiconductor inspection apparatus. Therefore, before the inspection, the inspection temperature is primarily set to be satisfied when the output of the heater 2 of the wafer chuck 1 is high (e.g., 500 W, here). Consequently, when the semiconductor wafer generates heat during the inspection, the inspection temperature can be kept constant by decreasing the output of the heater 2. Namely, the heat generation can be easily accepted up to 500 W.

For example, when the inspection temperature is 90° C., both the first valve 21 and the second valve 22 are opened approximately 50% and the degree of the open/close is further controlled. Thus, the outlet temperature of the cooling device 20 (outlet temperature of the heater 13) is controlled by both the refrigerator 100 and the auxiliary cooler 23 so that the circulating liquid enters in the wafer chuck 1 at the temperature significantly lower than the inspection temperature (e.g., 87° C.). In this case, the inlet temperature of the wafer chuck 1 decreases slightly from 87° C. (e.g., 85° C.). Finally, the temperature of the wafer chuck 1 is controlled to the inspection temperature (i.e., 90° C.) by slightly increasing the output of the heater 2 of the wafer chuck 1. In this case, when the semiconductor wafer generates heat during the inspection, the inspection temperature can be kept constant (i.e., 90° C.) by decreasing the output of the heater 2.

In addition, the ratio of the refrigerator 100 and the auxiliary cooler 23 to be used for the cooling is determined by the temperature of the circulating liquid supplied to the wafer chuck 1 (i.e., difference between the temperature of the circulating liquid supplied to the wafer chuck 1 and the inspection temperature). Namely, the ratio is determined by the difference between the inspection temperature and the inlet temperature of the wafer chuck 1 or the difference between the inspection temperature and the outlet temperature of the cooling device 20.

In the above described example, the inspection temperature is 90° C., the outlet temperature of the cooling device 20 (outlet temperature of the heater 13) is 87° C., and the inlet temperature of the wafer chuck 1 is 85° C. Thus, the outlet temperature of the cooling device 20 (outlet temperature of the heater 13) is controlled to 87° C. by controlling the open/close degree of the first valve 21 and the second valve 22 in accordance with the difference between 90° C. and 87° C. (=3° C.) or the difference between 90° C. and 85° C. (=5° C.).

The explanation will be made in condition that the first valve 21 can be completely closed and opened to 100%, but the second valve 22 is not completely closed since the refrigerator 100 is cooled too much if the second valve 22 is closed and no heat enters in the refrigerator 100. However, it is possible to close the second valve 22 completely and stop the operation of the refrigerator 100 when the first valve 21 is opened 100%. In this case, the wafer chuck 1 is cooled only by the auxiliary cooler 23.

Even in the case of high inspection temperature, when the temperature of the wafer chuck 1 is not increased and the removal of heat is not required because the semiconductor wafer does not generate a lot of heat or because of other reasons, the temperature of the wafer chuck 1 can be controlled only by the heater 2 of the wafer chuck 1 by determining not to cool the wafer chuck 1.

FIG. 3 is a flowchart showing an example of the operation of the controller 24 in the cooling device 20 of the semiconductor inspection apparatus concerning the embodiments of the present invention. First, the inspection temperature is checked. When the inspection temperature is low (30° C. or less, here) (YES in step ST1), the instruction is made to close the first valve 21 and open the second valve 22 completely (100%) (step ST2). Similarly, same as the conventional cooling device 10, the wafer chuck 1 is cooled by operating the refrigerator 100 as the cooling device 20.

On the other hand, when the inspection temperature is high (30° C. or more, here) (No in step ST1), the first valve 21 is gradually opened and the second valve 22 is gradually closed as the inspection temperature increases. Thus, opening and closing operations of the first valve 21 and the second valve 22 is controlled base on the inspection temperature and the inlet temperature of the wafer chuck 1 or the outlet temperature of the cooling device 20 (step ST3).

Here, the explanation will be made in condition that the inspection temperature is −60° C. to 150° C., for example. When the inspection temperature is 30° C. or more, the inspection temperature is judged to be high. Thus, when the inspection temperature is 30° C. to 150° C., the open/close degree of each valve is changed in accordance with the difference between the inspection temperature and the inlet temperature of the wafer chuck 1 or the difference between the inspection temperature and the outlet temperature of the cooling device 20

For the purpose of simplifying the explanation, assuming that the degree of the heat generation of the semiconductor wafer is approximately same (heat required to be removed is approximately same) even when the inspection temperature of the semiconductor inspection apparatus is high. When the inspection temperature is 40° C., for example, the first valve 21 is opened only 10% and the second valve 22 is closed 10% (opened 90%). When the inspection temperature is 140° C., the first valve 21 is opened 90% and the second valve 22 is closed 90% (opened 10%). When the inspection temperature is 150° C., the first valve 21 is opened 100% and the second valve 22 is closed 95% (opened 5%).

Note that the above described conditions of how to control the opening and closing of each valve are merely an example. It goes without saying that the conditions vary depending on the flow characteristic of each valve and the amount of heat generation (amount of heat generated by the semiconductor wafer), for example. Accordingly, the conditions of how to control the opening and closing of each valve can be arbitrarily determined according to the usage or the like as long as the temperature of the wafer chuck 1 is maintained to the desired inspection temperature by changing the degree of the opening and closing of each valve in accordance with the difference between the inspection temperature of the semiconductor inspection apparatus and the inlet temperature of the wafer chuck 1 or the outlet temperature of the cooling device 20. Thus, other calculation methods can be also used.

As explained above, in general, there is a problem that the pressure is increased when using the refrigerator 100 capable of cooling to a low temperature if the inspection temperature is high. Thus, the refrigerator 100 cannot be operated by receiving too much load. However, in the present embodiment, when the inspection temperature is high, while the refrigerator 100 is operated, a part of the circulating liquid is bypassed from the circulating liquid passage 20A to the bypass passage 20C and passed through the auxiliary cooler 23 and circulated in the flow passage of the tank 12 and the heater 13. Thus, the wafer chuck 1 can be cooled by using both lines.

When the inspection is not completed (NO in the step ST4), the process of the step ST3 is repeated. Namely, the opening and closing of the first valve 21 and the second valve 22 is controlled repeatedly based on the inspection temperature and the inlet temperature of the wafer chuck 1 or the outlet temperature of the cooling device 20. Thus, even when the amount of the heat generation becomes large and the removal of heat is required during the inspection, the wafer chuck 1 can be cooled by both the refrigerator 100 and the auxiliary cooler 23 and the inspection can be performed without applying too much load to the refrigerator 100.

Namely, in the cooling device 20 of the present embodiment, the controller 24 controls opening and closing operations of the first valve 21 and the second valve 22 based on the inspection temperature of the semiconductor inspection apparatus and the inlet temperature of the wafer chuck 1 or the outlet temperature of the cooling device 20. Thus, the controller 24 controls the temperature of the wafer chuck 1 by determining one of the flowing options: the wafer chuck 1 is cooled by the refrigerator 100; the wafer chuck 1 is cooled by the auxiliary cooler 23; the wafer chuck 1 is cooled by both the refrigerator 100 and the auxiliary cooler 23; or the wafer chuck 1 is not cooled.

Because of this, the heat can be removed efficiently without applying too much load to the refrigerator 100. Even when the inspection temperature is high and the removal of heat is required, the cooling device 20 having the refrigerator 100 capable of cooling to a low temperature can be operated even at high temperature without applying too much load to the refrigerator 100.

Consequently, electric characteristics of the semiconductor wafer (semiconductor device) can be inspected by using the cooling device 20 both cases when the inspection temperature of the semiconductor inspection apparatus is high and low. Thus, the semiconductor wafer generating a large amount of heat during the inspection can be also inspected without causing problems.

As explained above, the bypass passage 20C for allowing the circulating liquid to partly or wholly bypass the heat exchanger 15 is provided. Thus, the auxiliary cooler 23 cools the bypassed circulating liquid by the air used for the condenser 17, for example. Since the circulating liquid heated to high temperature is cooled by using the auxiliary cooler 23 in addition to the heat exchanger 15 of the refrigerator 100. Thus, the cooling device 20 having the refrigerator 100 capable of cooling to a low temperature can be operated even at high temperature. In addition, heat can be removed even when the inspection temperature is high.

Note that the reference temperature for judging whether the inspection temperature is low or high is specified to 30° C. in the present embodiment for explanation. However, it goes without saying that the reference temperature can be appropriately determined as necessary. For example, the reference temperature can be specified to 20° C. or 40° C.

As explained above, in the cooling device 20 of the embodiment of the present invention, since the bypass passage 20C for allowing the circulating liquid to partly or wholly bypass the heat exchanger 15 is provided, the cooling device 20 having the refrigerator 100 capable of cooling to a low temperature can be operated even at high temperature and heat can be removed even when the inspection temperature is high. Thus, the inspection can be performed both cases when the inspection temperature of the semiconductor inspection apparatus is high and low. Consequently, the semiconductor wafer generating a large amount of heat during the inspection can be also inspected without causing problems.

Note that any configurations of the embodiments can be modified, and any configurations of the embodiments can be omitted in the present invention within the scope of the present invention.

INDUSTRIAL APPLICABILITY

The cooling device of the present invention can be used as the inspection apparatus of the semiconductor wafer even when the inspection temperature is high in addition to the case when the inspection temperature is low.

DESCRIPTION OF THE REFERENCE NUMERALS

1: wafer chuck
2: heater of wafer chuck 1
10, 20: cooling device (chiller)
10A, 20A: circulating liquid passage
10B, 20B: refrigerant flow passage
11: pump
12: tank
13: heater
14, 24: controller
15: heat exchanger
16: compressor
17: condenser
18: fan
19: expansion valve
20C: bypass passage
21: first valve
22: second valve
23: auxiliary cooler
100: refrigerator

The invention claimed is:

1. A cooling device for semiconductor inspection apparatus to adjust a temperature of an inspection apparatus of a semiconductor wafer, comprising:
   a controller for controlling the temperature of a wafer chuck on which the semiconductor wafer is placed;
   a circulating liquid passage through which circulating liquid for cooling the wafer chuck flows; and
   a refrigerator for cooling the circulating liquid, wherein
   a tank for holding the circulating liquid of low temperature; a pump that circulates the circulating liquid held in the tank through the circulating liquid passage; and a heater for heating the circulating liquid are arranged on an upstream side of the wafer chuck and a downstream side of the refrigerator in the circulating liquid passage,
   a heat exchanger of the refrigerator for cooling the circulating liquid is arranged on a downstream side of the wafer chuck in the circulating liquid passage,
   a bypass passage is provided for allowing the circulating liquid to bypass the refrigerator without passing through the heat exchanger of the refrigerator from a position between the wafer chuck and the heat exchanger in the circulating liquid passage,
   a first valve is provided on the bypass passage for adjusting the amount of the circulating liquid to flow in the bypass passage,
   a second valve is provided on the circulating liquid passage for adjusting the amount of the circulating liquid to flow in the heat exchanger, and
   another refrigerator is not provided on the bypass passage.

2. The cooling device for semiconductor inspection apparatus according to claim 1, wherein
   the controller controls the temperature of the wafer chuck by controlling opening and closing operations of the first valve and the second valve based on an inspection temperature of the semiconductor inspection apparatus and an inlet temperature of the wafer chuck or an outlet temperature of the cooling device.

3. The cooling device for semiconductor inspection apparatus according to claim 1, wherein
   an auxiliary air-cooling or water-cooling cooler is provided on the bypass passage,
   the controller determines one of the following operations based on an inspection temperature of the semiconductor inspection apparatus and either an inlet temperature of the wafer chuck or an outlet temperature of the cooling device:
   cooling the wafer chuck by the refrigerator;
   cooling the wafer chuck by the auxiliary cooler;
   cooling wafer chuck by both the refrigerator and the auxiliary cooler; or
   not cooling the wafer chuck, and
   the controller controls the temperature of the wafer chuck by controlling opening and closing operations of the first valve and the second valve.

4. The cooling device for semiconductor inspection apparatus according to claim 1, wherein
   the controller controls an outlet temperature of the heater so that the circulating liquid enters in the wafer chuck at the temperature slightly lower or slightly higher than an inspection temperature.

* * * * *